US010896722B1

(12) United States Patent
Li et al.

(10) Patent No.: US 10,896,722 B1
(45) Date of Patent: Jan. 19, 2021

(54) INTEGRATED ASSEMBLIES HAVING SENSE-AMPLIFIER-CIRCUITRY DISTRIBUTED AMONGST TWO OR MORE LOCATIONS, AND HAVING CIRCUITRY CONFIGURED TO ISOLATE LOCAL COLUMN-SELECT-STRUCTURES FROM A GLOBAL STRUCTURE

(71) Applicant: Micron Technology, Inc., Boise, ID (US)

(72) Inventors: Jiyun Li, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/684,835

(22) Filed: Nov. 15, 2019

(51) Int. Cl.
*G11C 5/06* (2006.01)
*G11C 11/4091* (2006.01)
*G11C 11/4094* (2006.01)
*G11C 11/408* (2006.01)

(52) U.S. Cl.
CPC ...... *G11C 11/4091* (2013.01); *G11C 11/4085* (2013.01); *G11C 11/4087* (2013.01); *G11C 11/4094* (2013.01)

(58) Field of Classification Search
CPC ....... G11C 5/063; G11C 7/18; G11C 11/4097; G11C 5/025; G11C 5/04

USPC ........................................................ 365/63
See application file for complete search history.

(56) References Cited

U.S. PATENT DOCUMENTS 7,233,537 B2 * 6/2007 Tanizaki ................ G11C 7/062
365/107
2018/0239531 A1 * 8/2018 Lea ..................... G11C 11/4093

* cited by examiner

*Primary Examiner* — Son T Dinh
(74) *Attorney, Agent, or Firm* — Wells St. John P.S.

(57) ABSTRACT

Some embodiments include an integrated assembly having first memory cells in a first array and second memory cells in a second array. First and second digit lines extend along columns of the first and second arrays, respectively. The first digit lines are comparatively coupled with the second digit lines through sense-amplifier-circuitry. The sense-amplifier-circuitry is distributed amongst at least two patch locations. A first of the patch locations has a first portion of the sense-amplifier-circuitry and has a first local column-select-structure. A second of the patch locations has a second portion of the sense-amplifier-circuitry and has a second local column-select-structure. A column-select-bus extends from decoder-circuitry to the first and second local column-select-structures. The column-select-bus is selectively coupled to the first and second local column-select-structures through first and second switches, respectively.

30 Claims, 13 Drawing Sheets

INTEGRATED ASSEMBLIES HAVING SENSE-AMPLIFIER-CIRCUITRY DISTRIBUTED AMONGST TWO OR MORE LOCATIONS, AND HAVING CIRCUITRY CONFIGURED TO ISOLATE LOCAL COLUMN-SELECT-STRUCTURES FROM A GLOBAL STRUCTURE

TECHNICAL FIELD

Memory arrays (e.g., DRAM arrays). Integrated assemblies comprising vertically-stacked decks. Integrated assemblies having sense-amplifier-circuitry distributed amongst two or more locations, and having circuitry configured to isolate local column-select-structures from a global structure (a column-select-bus).

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("ARRAY-1" and "ARRAY-2"), with each of the arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (ARRAY-1), and digit lines D0*-D8* are associated with the second array (ARRAY-2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

The individual digit lines are independently addressed utilizing column decoder circuitry (DECODER).

A continuing goal of integrated circuit fabrication is to increase packing density and to thereby increase the level of integration. It would be desirable to develop three-dimensional arrangements having tightly packed memory.

DETAILED DESCRIPTION OF THE ILLUSTRATED EMBODIMENTS

Some embodiments include integrated assemblies (e.g., DRAM assemblies) having sense-amplifier-circuitry distributed amongst two or more separate areas. The separate areas may be referred to as patch locations, and together may be considered to form a quilt pattern. Each of the patch locations may be coupled with an associated local column-select-structure (e.g., wire, line, etc.) which selectively couples digit lines from the patch locations with input/output (I/O) to transfer data to and from the digit lines. The local column-select-structures may be selectively coupled to one or more column-select-buses (CS-Buses) through switches (e.g., transistors). The CS-Buses may be coupled with Control Circuitry (e.g., Column-Decoder-Circuitry). A problem with some conventional integrated assemblies may be that all of the digit lines of a memory arrangement (e.g., DRAM) are non-selectively coupled with Column-Decoder-Circuitry through a CS-Bus, and the routing through all of such digit lines creates extra capacitance on the CS-Bus to slow down a signal and/or lead to other difficulties. Some embodiments include switches which selectively couple some digit lines of a memory arrangement to a CS-Bus while decoupling other digit lines from the CS-Bus, which can alleviate or prevent problems associated with conventional assemblies. Example embodiments are described with reference to FIGS. 4-14.

Figure 4:
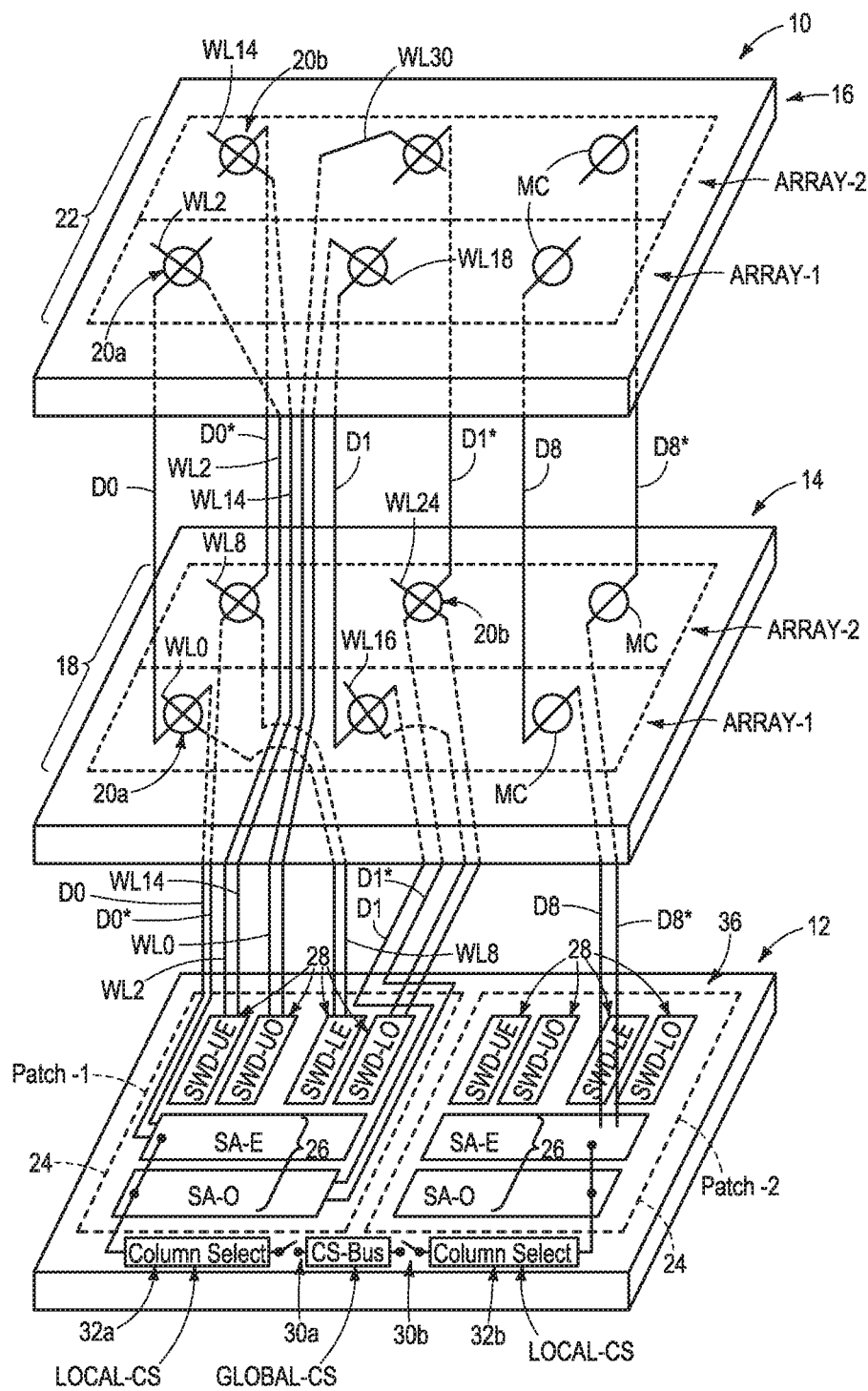
FIG. 4 is a schematic diagram of an example integrated assembly having multiple decks which are vertically displaced relative to one another.

Referring to FIG. 4, an integrated assembly 10 includes a base 12, a first deck 14 over the base and a second deck 16 over the first deck. The structures 12, 14 and 16 are vertically stacked one atop another. The base 12, first deck 14 and second deck 16 may be considered to be examples of levels that are stacked one atop the other. The levels may be within different semiconductor dies, or at least two of the levels may be within the same semiconductor die.

Figure 1:
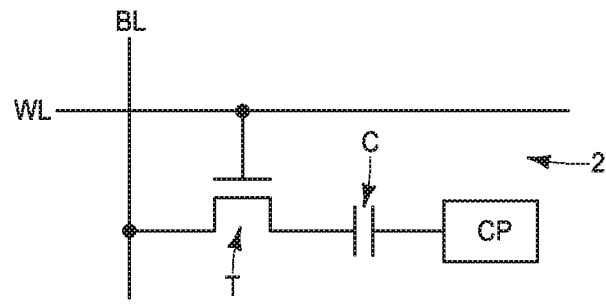
FIG. 1 is a schematic diagram of a prior art memory cell having one transistor and one capacitor.
Figure 2:
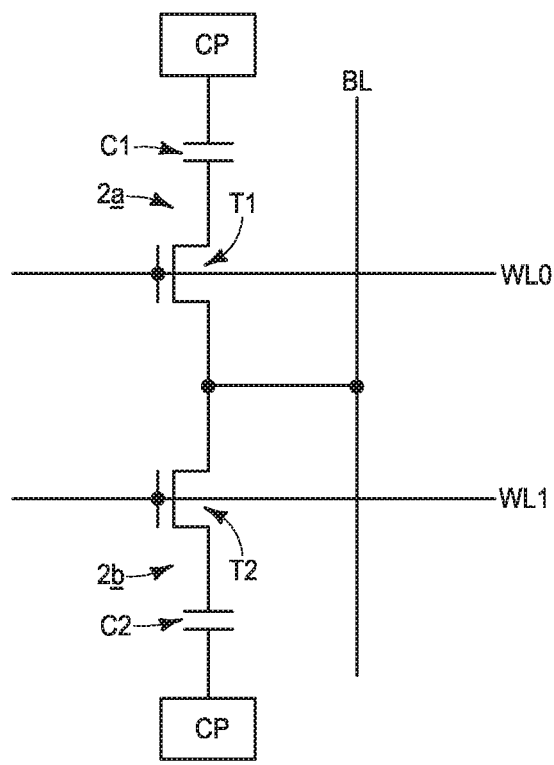
FIG. 2 is a schematic diagram of a pair of prior art memory cells which each have one transistor and one capacitor, and which share a bitline connection.
Figure 3:
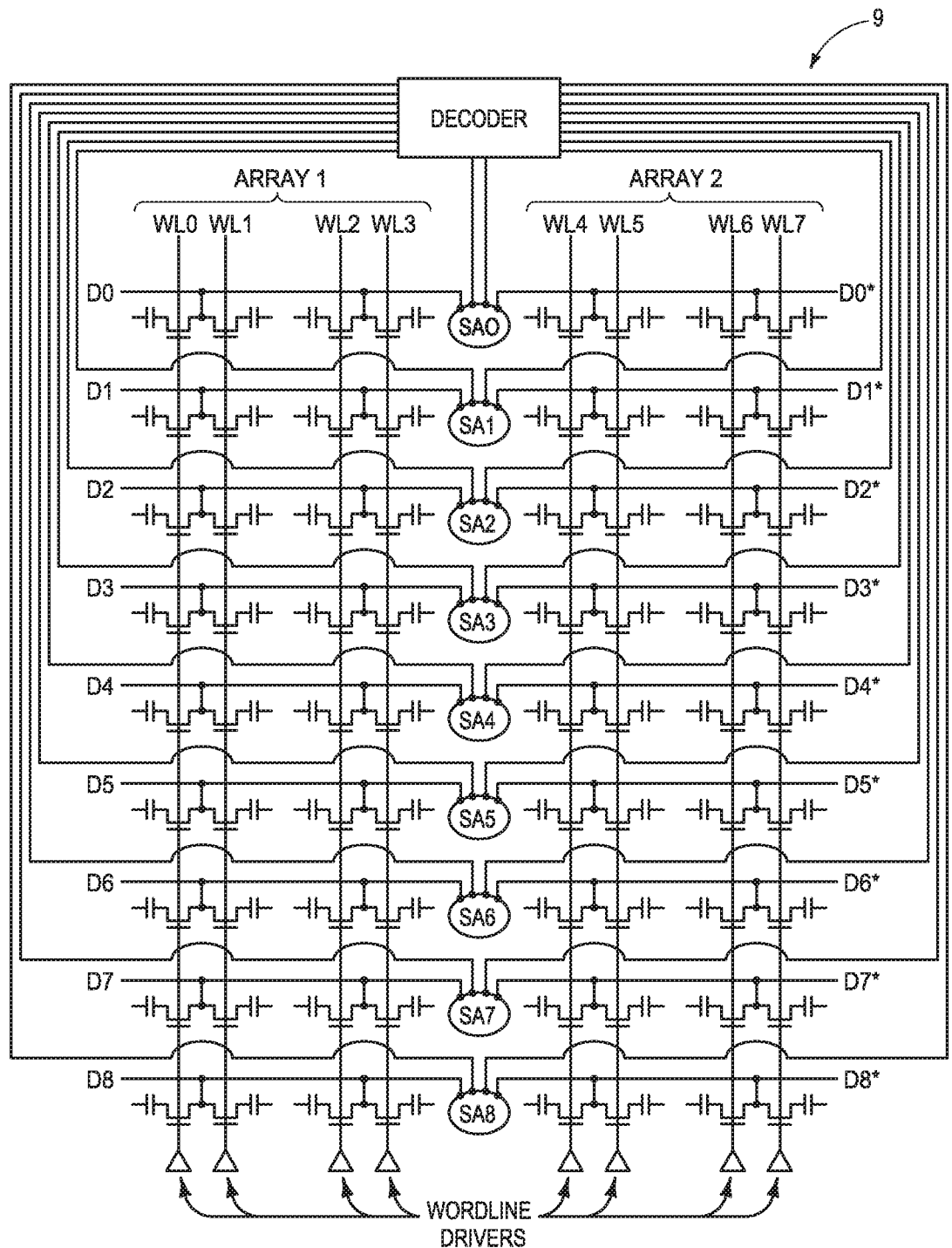
FIG. 3 is a schematic diagram of a prior art integrated assembly having open bitline architecture.

The first and second decks 14 and 16 have memory regions 18 and 22, respectively. First and second memory arrays (ARRAY-1 and ARRAY-2) are supported by the first and second decks 14 and 16, with each of the memory arrays having a first portion along the first (lower) deck 14 and a second portion along the second (upper) deck 16. The first memory array includes first memory cells (MC) 20a, and the second memory array includes second memory cells (MC) 20b. The memory cells are diagrammatically illustrated as circles. Only some of the first and second memory cells are labeled. The first and second memory arrays may comprise any suitable number of memory cells, and in some embodiments may comprise hundreds, thousands, millions, etc., of memory cells. The memory cells MC may be DRAM cells, and in some embodiments may be configured in arrangements of the types described above with reference to prior art FIGS. 1-3 (i.e., ARRAY-1 and ARRAY-2 may be DRAM arrays).

In some embodiments, the first and second decks 14 and 16 may be referred to as first and second memory decks, respectively.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

In the shown embodiment, the base 12 comprises sense-amplifier-circuitry (SA) 26 and wordline-driver-circuitry (WD) 28.

The sense-amplifier-circuitry includes regions (modules) labeled "SA-E" to identify them as being associated with an "even" portion of a circuit, and regions (modules) labeled "SA-O" to identify them as being associated with an "odd" portion of a circuit. The terms "even" and "odd" are arbitrary, and are utilized to distinguish the different sense-amplifier-circuitries from one another. The illustrated configuration has the sense-amplifier-modules SA-O and SA-E paired with one another and distributed amongst patch locations (patch regions) 24. The SA-O and SA-E modules within each of the patch regions 24 are laterally displaced relative to one another.

Two of the patch locations 24 are shown in FIG. 4, and are labeled as Patch-1 and Patch-2, respectively. The patch locations 24 are spread across the base 12, and are spaced apart from one another. Although two patch locations 24 are illustrated, it is to be understood that any suitable number of patch locations may be utilized. In some embodiments there may be at least two of the patch locations, at least three of the patch locations, at least four of the patch locations, at least eight of the patch locations, etc.

The modules SA-O and SA-E of Patch-1 may be considered to be portions of an overall configuration of sense-amplifier-circuitry, with such configuration of sense-amplifier-circuitry being associated with the memory within ARRAY-1 and ARRAY-2 (i.e., the memory along Decks 14 and 16). Each of the patch locations may comprise its own portion of the overall configuration of the sense-amplifier-circuitry associated with the memory within ARRAY-1 and ARRAY-2.

In the shown embodiment both of the patch locations 24 are located directly under the memory cells MC of ARRAY-1 and ARRAY-2. In some embodiments there may be a large number of patch locations, and one or more of said patch locations may be under the memory cells of ARRAY-1 and ARRAY-2.

The wordline-driver-circuitry (i.e., row-driver circuitry) includes regions labeled SWD-UE, SWD-UO, SWD-LE and SWD-LO. The acronym SWD stands for sub-wordline-driver, and is utilized to emphasize that the components SWD-UE, SWD-UO, SWD-LE and SWD-LO are portions of the general wordline-driver-circuitry. The wordline-driver-circuitries SWD-UE and SWD-LE are together utilized during operation of the memory cells (MC) associated with the "even" circuits coupled with SA-E; with SWD-LE driving wordlines along the lower deck 14, and with SWD-UE driving wordlines along the upper deck 16. The wordline-driver-circuitries SWD-LO and SWD-UO are together utilized during operation of the memory cells (MC) associated with the "odd" circuits coupled with SA-O; with SWD-LO driving wordlines along the lower deck 14, and with SWD-UO driving wordlines along the upper deck 16. In some embodiments, the wordline-driver-circuitries SWD-UE and SWD-LE may be considered to be first wordline-driver-circuitry (the circuitry utilized to drive the "even" circuits), and the wordline-driver-circuitries SWD-UO and SWD-LO may be considered to be second wordline-driver-circuitry (the circuitry utilized to drive the "odd" circuits). In some embodiments, the wordline-driver-circuitries SWD-UE, SWD-UO, SWD-LO and SWD-LE may be considered to be separate modules relative to one another.

First digit lines D0, D1 and D8 are associated with the first memory array (ARRAY-1). The first digit lines D0, D1 and D8 extend along columns of the first memory array (ARRAY-1) and are coupled with first memory cells 20a of the first memory array. The digit lines D0, D1 and D8 are laterally spaced from one another, and may be representative of a large number of substantially identical digit lines extending across the first memory array; with the term "substantially identical" meaning identical to within reasonable tolerances of fabrication and measurement.

The first digit lines alternate between even first digit lines and odd first digit lines, with the digit lines D0 and D8 being representative of even first digit lines, and with the digit line D1 being representative of an odd first digit line. The even first digit lines (e.g., D0) are coupled with SA-E modules (with D0 being coupled with a module in Patch-1, and with D8 being coupled with a module in Patch-2). The odd first digit lines (e.g., D1) are coupled with SA-O modules. The digit lines D0, D1 and D8 have first portions along the first deck 14 and have second portions along the second deck 16.

Second digit lines D0*, D1* and D8* are associated with the second memory array (ARRAY-2). The second digit lines D0*, D1* and D8* extend along columns of the second memory array and are coupled with second memory cells 20b of the second memory array (ARRAY-2). The digit lines D0*, D1* and D8* are laterally spaced from one another, and may be representative of a large number of substantially identical digit lines extending across the second memory array.

The second digit lines alternate between even second digit lines and odd second digit lines, with the digit lines D0* and D8* being representative of even second digit lines, and with the digit line D1* being representative of an odd second digit line. The even second digit lines (e.g., D0*) are coupled with the SA-E modules and the odd second digit lines (e.g., D1*) are coupled with the SA-O modules. The digit lines D0*, D1* and D8* have first portions along the first deck 14 and have second portions along the second deck 16.

Figure 14:
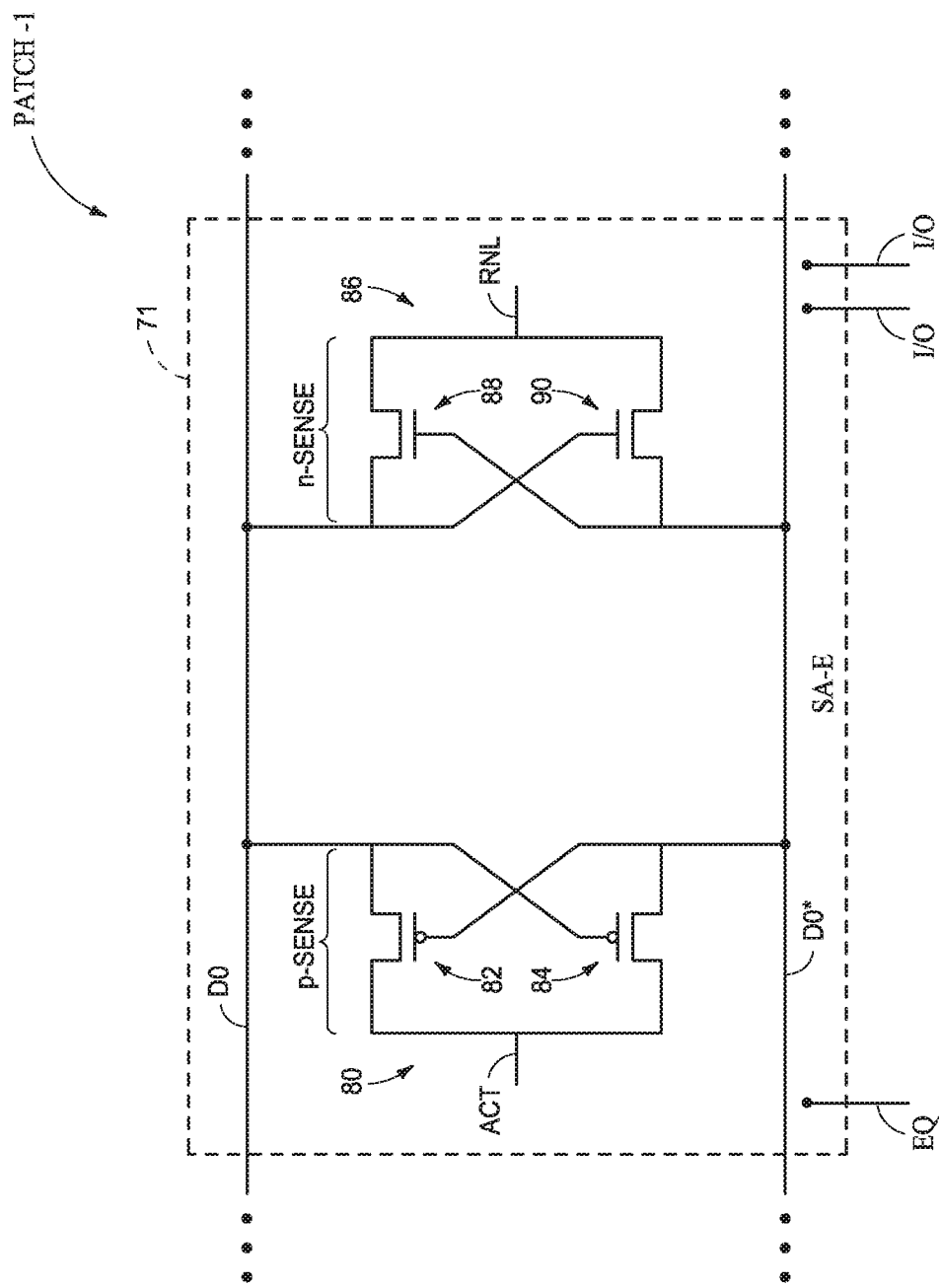
FIG. 14 is a diagrammatic schematic diagram of a region of example sense-amplifier-circuitry.

The even first digit lines D0 and D8 are comparatively coupled with the even second digit lines D0* and D8* through the SA-E modules within Patches 1 and 2, respectively; and the odd first digit line D1 is comparatively coupled with the odd second digit line D1* through the SA-O module within Patch-1. For purposes of understanding this disclosure and the claims that follow, a first digit line is "comparatively coupled" with a second digit line through a sense-amplifier-circuitry (or a sense-amplifier-module) if the sense-amplifier-circuitry (or sense-amplifier-module) is configured to compare electrical properties (e.g., voltage) of the first and second digit lines with one another. FIG. 14 (discussed below) shows an example sense-amplifier-module SA-E, and shows an example application in which digit lines D0 and D0* are comparatively coupled through the example sense-amplifier-module.

In the illustrated embodiment of FIG. 4, the digit lines D0, D0*, D1, D1*, D8 and D8* are all vertically displaced relative to the sense-amplifier-circuitries 26 within the patch locations 24. Also, the digit lines D0, D0*, D1, D1*, D8 and D8* are all laterally displaced relative to one another.

Referring still to FIG. 4, a first set of wordlines extends along the first memory array (ARRAY-1). Representative wordlines of such first set are labeled as WL0, WL2, WL16 and WL18. The wordlines of the first set may be referred to as first wordlines. A second set of wordlines extends along the second memory array (ARRAY-2). Representative wordlines of such second set are labeled as WL8, WL14, WL24 and WL30. The wordlines of the second set may be referred to as second wordlines.

Each of the first memory cells 20a within the first memory array (ARRAY-1) is uniquely addressed by one of the digit lines extending along the first memory array (e.g., one of the digit lines D0, D1 and D8), and one of the wordlines extending along the first memory array (e.g., one of the wordlines WL0, WL2, WL16 and WL18). Similarly, each of the memory cells 20b within the second memory array (ARRAY-2) is uniquely addressed by one of the digit lines extending along the second memory array (e.g., one of the digit lines D0*, D1* and D8*), and one of the wordlines extending along the second memory array (e.g., one of the wordlines WL8, WL14, WL24 and WL30). In some embodiments, the digit lines along the first memory array (ARRAY-1) may be referred to as a first set of digit lines, while the digit lines along the second memory (ARRAY-2) are referred to as a second set of digit lines; and similarly the wordlines along the first memory array (ARRAY-1) may be referred to as a first set of wordlines, while the wordlines along the second memory (ARRAY-2) are referred to as a second set of wordlines. Accordingly, each of the memory cells 20a of ARRAY-1 may be considered to be uniquely addressed utilizing a wordline from the first set of wordlines in combination with a digit line from the first set of digit lines; and each of the memory cells 20b of the ARRAY-2 may be considered to be uniquely addressed utilizing a wordline from the second set of wordlines in combination with a digit line from the second set of digit lines.

An advantage of the configuration of FIG. 4 may be that all of the sense-amplifier-circuitry and all of the wordline-driver-circuitry is provided directly under the memory arrays (ARRAY-1 and ARRAY-2) in the patch locations 24, which may enable tight packing of the memory arrays across a semiconductor substrate; or in other words, which may conserve valuable semiconductor real estate as compared to conventional configurations in which at least some of the sense-amplifier-circuitry and/or at least some of the word-line-driver-circuitry is not directly under a memory array. The vertical stacking of regions of the memory arrays (ARRAY-1 and ARRAY-2) may further conserve valuable semiconductor real estate.

Figure 5:
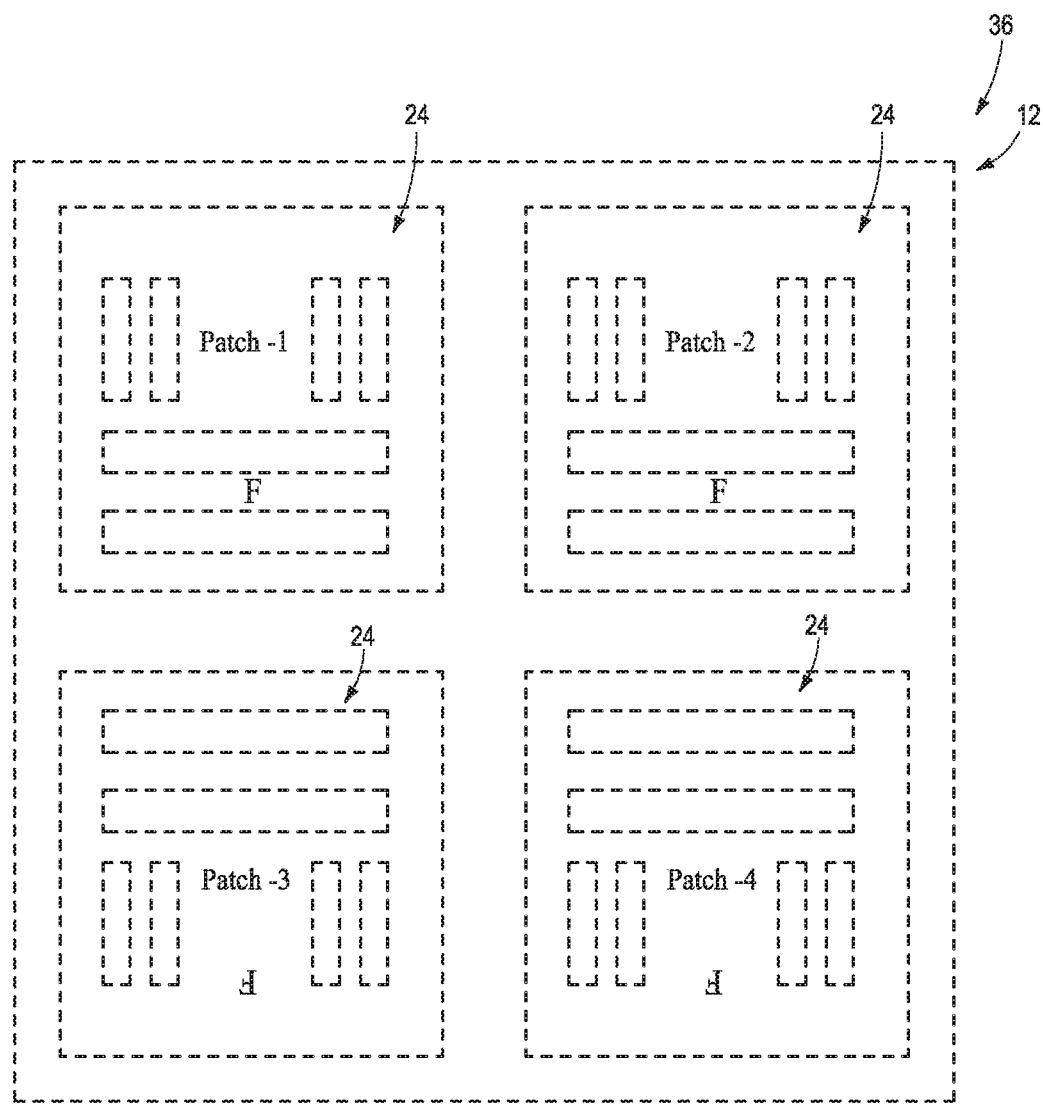
FIG. 5 is a diagrammatic top view of a region of a deck having multiple patch locations.

In some embodiments the patch locations 24 may be incorporated into a quilted pattern 36 which is directly under the memory cells MC of the first and second memory arrays (ARRAY-1 and ARRAY-2). The term "quilted pattern" is utilized to indicate that the patch locations 24 may be distributed as a substantially repeating pattern of subunits (with each subunit being a patch 24). Such subunits may be considered to be analogous to the "blocks" (patches) of fabric which are incorporated into some types of quilts. The patch locations 24 may all have a same orientation as one another (as shown in FIG. 4), or at least one of the patch locations may have a different orientation relative to at least one other of the patch locations. For instance, FIG. 5 shows a top-down view of a region of an example base 12 having a quilted pattern 36 which has multiple patch locations 24 (Patch-1, Patch-2, Patch-3 and Patch-4). The relative orientations of the patch locations are illustrated with the symbol "F". In the illustrated embodiment, the third and fourth patch locations (Patch-3 and Patch-4) are inverted relative to the first and second patch locations (Patch-1 and Patch-2). Various regions are shown in dashed-line (phantom view) within the patch locations 24 of FIG. 5 to assist the reader in understanding the relative orientations of the patch locations. In some embodiments, the configuration of FIG. 5 may enable a switch to control two patches at a time by the feeding the signal down in a socket between the two patches.

Referring again to FIG. 4, the sense-amplifier-circuitries 26 within the patch locations 24 are coupled with column-select-structures 32 (Column Select, also referred to a Local-column-select-structures, or LOCAL-CS), which in turn are coupled to a CS-Bus (also referred to as a global-column-select-structure, or GLOBAL-CS) through switches 30. Specifically, Patch-1 is coupled to a first column-select-structure (LOCAL-CS) 32a which is coupled to the CS-Bus (GLOBAL-CS) through a first switch 30a, and Patch-2 is coupled to a second column-select-structure (LOCAL-CS) 32b which is coupled to the CS-Bus (GLOBAL-CS) through a second switch 30b. The CS-Bus (GLOBAL-CS) may be in turn coupled with column-decoder-circuitry (not shown in FIG. 4). The column-select-structures (LOCAL-CS) 32 and at least part of the CS-Bus (GLOBAL-CS) may be along the base 12 as shown.

Figure 6:
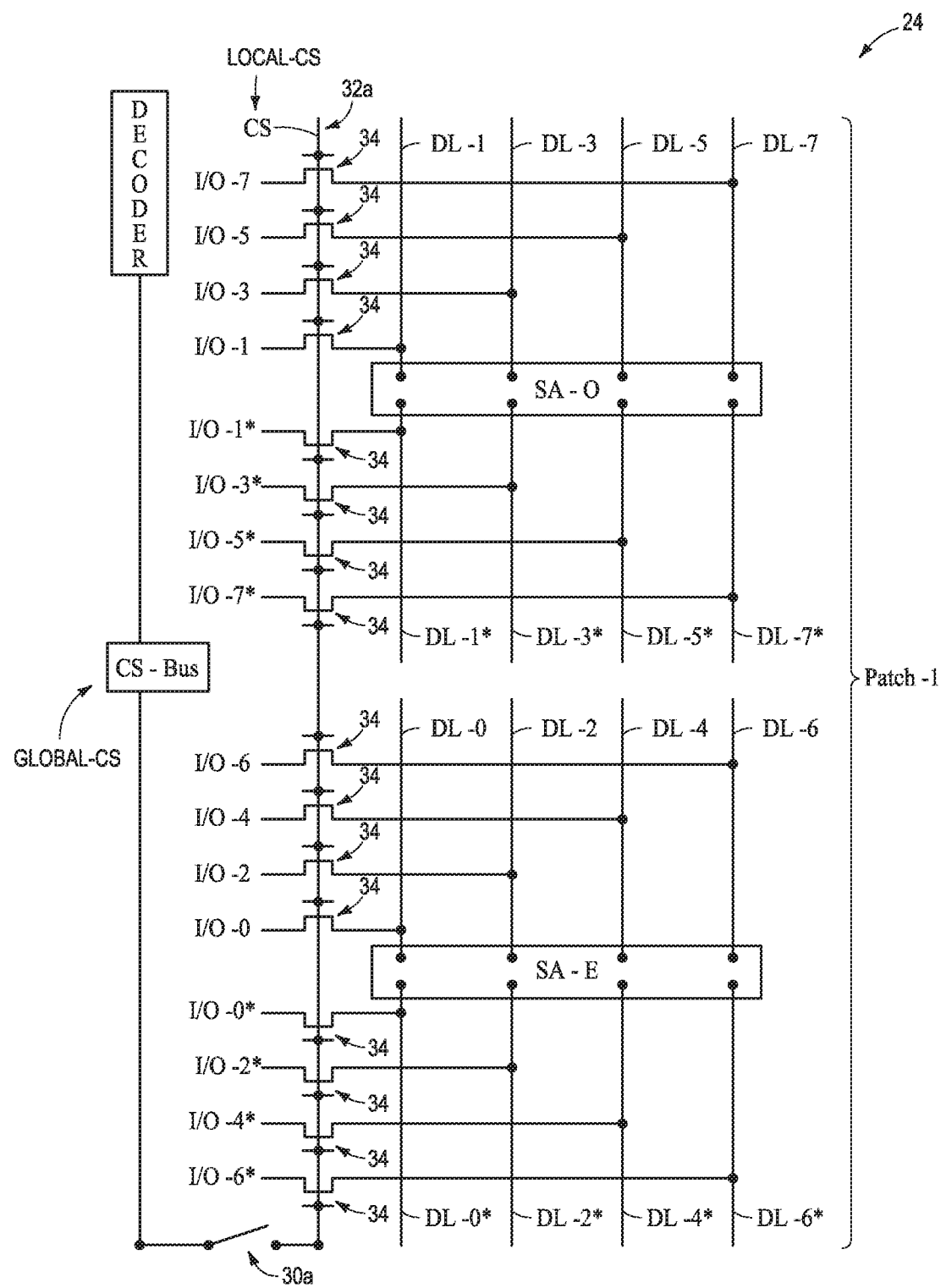
FIG. 6 is a diagrammatic schematic view of a region of an example patch location.

FIG. 6 schematically shows example circuitry associated with a patch locations 24 in more detail. FIG. 6 specifically shows example circuitry associated with Patch-1 of FIG. 4, but it is to be understood that substantially identical circuitry may be associated with all of the patch locations of an integrated assembly.

The odd digit lines DL-1, DL-1*, DL-3, DL-3*, DL-5, DL-5*, DL-7 and DL-7* extend to the SA-O module, and the even digit lines DL-0, DL-0*, DL-2, DL-2*, DL-4, DL-4*, DL-6 and DL-6*extend to the SA-E module.

Each of the digit lines is selectively coupled with input/output circuitry (I/O) through a switch 34 (for instance, DL-1 is selectively coupled to I/O-1 through a switch 34). In the shown embodiment, the switches 34 are transistors. Each of the transistors 34 has a gate which is controlled by the column-select-structure 32a (CS; also referred to as LOCAL-CS). Accordingly, the column-select-structure 32a may be utilized for controllably coupling individual digit lines to the input/output circuitry associated with such digit lines. In some embodiments, the column-select-structure 32a may be considered to be a local column-select-structure associated with the patch location 24 designated as Patch-1. Each of the patch locations may have its own local column-select-structure associated therewith. The local column-select-structures may be considered to be associated with the digit lines which are controlled by such local column-select-structures (i.e., the local column-select-structure 32a of FIG. 6 may be considered to be associated with the digit lines DL-0, DL-1, etc., of Patch-1).

The local column-select-structure 32a is selectively coupled to a column-select-bus (CS-Bus; also referred to as GLOBAL-CS) through the switch 30a, and the CS-Bus is in turn coupled with decoder-circuitry (DECODER). The switch 30a may comprise any suitable configuration, and in some embodiments may be a transistor. The switch 30a enables the circuitry of Patch-1 to be coupled with the CS-Bus during utilization of such circuitry, and to be electrically isolated from the CS-Bus when the circuitry of Patch-1 is not being utilized (i.e., is not being subjected to memory operations; such as, for example, read, write, erase, etc.).

Although the illustrated diagram of Patch-1 utilizes eight digit lines from each of ARRAY-1 and ARRAY-2 (DL-0 through DL-7 from ARRAY-1, and DL-0* through DL-7* from ARRAY-2) it is to be understood that in other embodiments the patch may utilize more than eight digit lines from each of the arrays, or fewer than eight digit lines from each of arrays.

Referring again to FIG. 4, such shows that each of the illustrated patch locations 24 (Patch-1 and Patch-2) has an associated local column-select-structure (i.e., a first local column-select-structure 32a for Patch-1 and a second local column-select-structure 32b for Patch-2), and that each of the local column-select structures is selectively coupled to the CS-Bus through a switch (i.e., a first switch 30a for Patch-1 and a second switch 30b for Patch-2). The switches 30a and 30b may be utilized to selectively couple/decouple the local column-select-structures 32a and 32b from the CS-Bus depending on whether the patch locations 24 associated with the column-select-structures are being operated or not. The decoupling of a column-select-structure from the CS-Bus during periods that an associated patch location is not being operated may advantageously enable undesired capacitive coupling to be reduced by removing the capacitive coupling associated with the non-operated patch location to be isolated from the CS-Bus. For instance, switch 30a may be utilized to isolate the column-select-structure 32a and the associated Patch-1 from the CS-Bus during periods that Patch-1 is not being operated.

Figure 7:
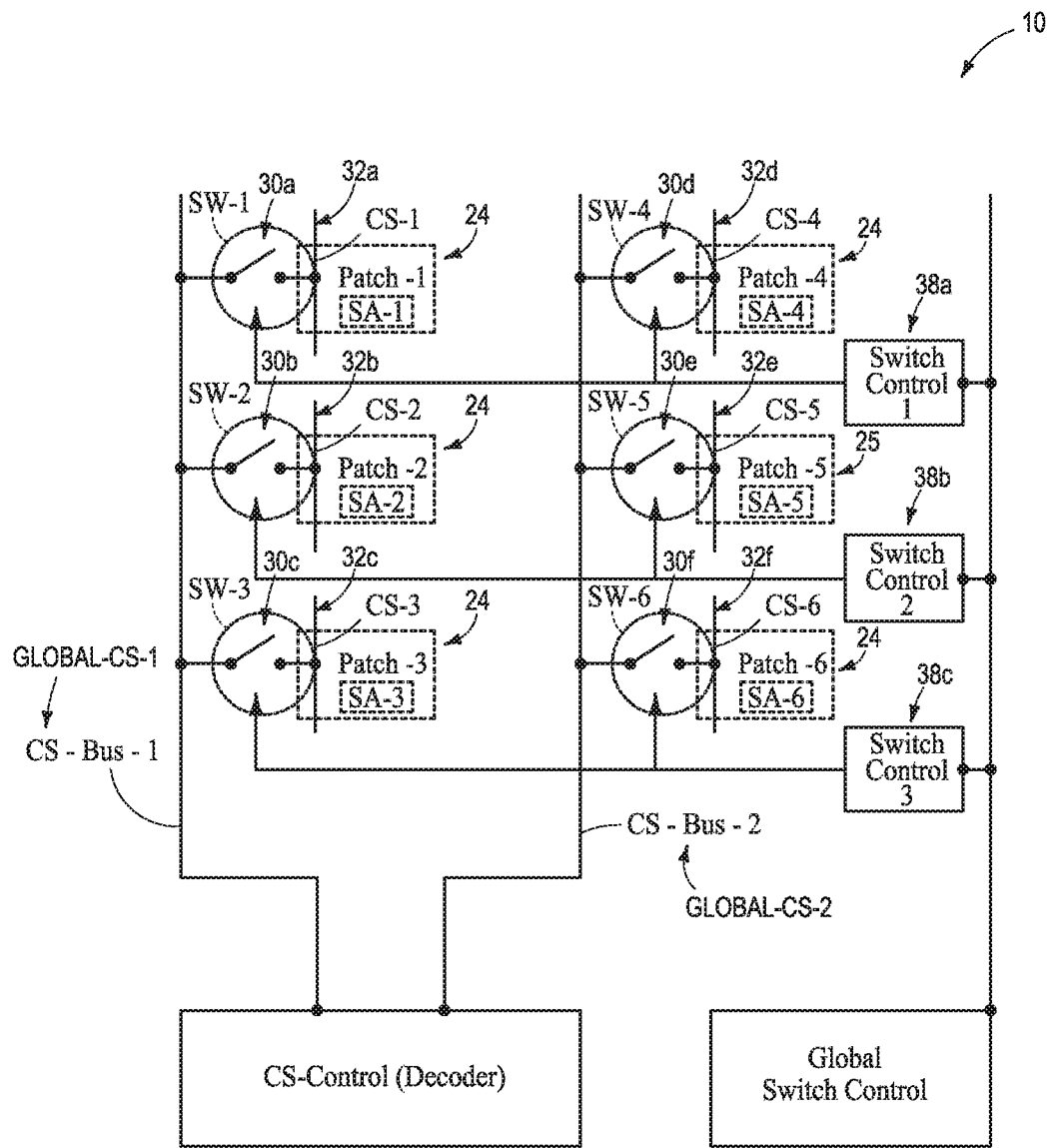
FIG. 7 is a diagrammatic schematic view of a region of an example device having multiple patch locations with local column select structures controllably coupled with decoder circuitry.

The patch locations 24 of FIG. 4 are representative of numerous patch locations that may be utilized in conjunction with memory (e.g., the memory within ARRAY-1 and ARRAY-2 of FIG. 4). FIG. 7 schematically illustrates an integrated assembly 10 comprising six patch locations 24 (labeled Patch-1, Patch-2, Patch-3, Patch-4, Patch-5 and Patch-6). The sense-amplifier-circuitry 26 (FIG. 4) may be considered to be subdivided amongst the six patch locations, with each of the patch locations 24 including a portion of the sense-amplifier-circuitry. For instance, Patches 1-6 may be considered to comprise first, second, third, fourth, fifth and sixth portions of the sense-amplifier-circuitry, respectively (with such portions of the sense-amplifier-circuitry being diagrammatically illustrated in the patches as SA-1, SA-2, SA-3, SA-4, SA-5 and SA-6). Although FIG. 7 shows a six patch locations, in some embodiments there may be more than the illustrated six patch locations, or fewer than the illustrated six patch locations. In some example embodiments, there may be at least four of the patch locations.

The assembly 10 of FIG. 7 includes CS-Control (e.g., a decoder), which is coupled with two CS-Buses (labeled as CS-Bus-1 and CS-Bus-2; and also referred to as GLOBAL-CS-1 and GLOBAL-CS-2). The CS-Buses may be referred to as a first CS-Bus (CS-Bus-1) and a second CS-Bus (CS-Bus-2); or as a first global-CS-structure (GLOBAL-CS-1) and a second global-CS-structure (GLOBAL-CS-2).

Each of the CS-Buses is selectively coupled with three local column-select-structures 32 (also referred to a local-column-select-structures) through switches 30. Specifically, CS-Bus-1 is coupled with column-select-structures 32a, 32b and 32c (also labeled as CS-1, CS-2 and CS-3) through switches 30a, 30b and 30c (also labeled as SW-1, SW-2 and SW-3); and CS-Bus-2 is coupled with column-select-structures 32d, 32e and 32f (also labeled as CS-4, CS-5 and CS-6) through switches 30d, 30e and 30f (also labeled as SW-4, SW-5 and SW-6). The local column-select-structures 32 are associated with individual patch locations 24; and specifically are associated with portions of the sense-amplifier-circuitry within the patch locations. Specifically, CS-1 is associated with the first portion of the sense-amplifier-circuitry within Patch-1, CS-2 is associated with the second portion of the sense-amplifier-circuitry within Patch-2, CS-3 is associated with the third portion of the sense-amplifier-circuitry within Patch-3, CS-4 is associated with the fourth portion of the sense-amplifier-circuitry within Patch-4, CS-5 is associated with the fifth portion of the sense-amplifier-circuitry within Patch-5, and CS-6 is associated with the sixth portion of the sense-amplifier-circuitry within Patch-6. Each of the Patches 1-6 may be substantially identical to the Patch-1 described above with reference to FIG. 6, except that the Patches 2-6 may utilize different digit lines than those specifically designated in FIG. 6 as being associated with Patch-1.

The switches 30a-f are selectively operated utilizing local Switch Control Units 38a, 38b and 38c (also labeled as Switch Control 1, Switch Control 2 and Switch Control 3).

Each of the Switch Control Units operates two of the switches (e.g., the Switch Control Unit 38a operates the switches 30a and 30d).

The local Switch Control Units 38a, 38b and 38c are coupled with a Global Switch Control (i.e., global-switch-control-circuitry) which selectively controls operation of the individual local Switch Control Units during operation of the assembly 10.

Some of the claims provided below refer to the assembly analogous that of FIG. 7, but comprising "at least four patch locations". In interpreting such claims, it may be useful to understand the patch locations shown as Patch-1, Patch-2, Patch-4 and Patch-5 as being first, second, third and fourth patch locations, respectively. Accordingly, in some embodiments first and third patch locations (Patch-1 and Patch-4) may be considered to share a first Switch Control Unit 38a, and second and fourth patch locations (Patch-2 and Patch-5) may be considered to share a second Switch Control Unit 38b.

Figure 8:
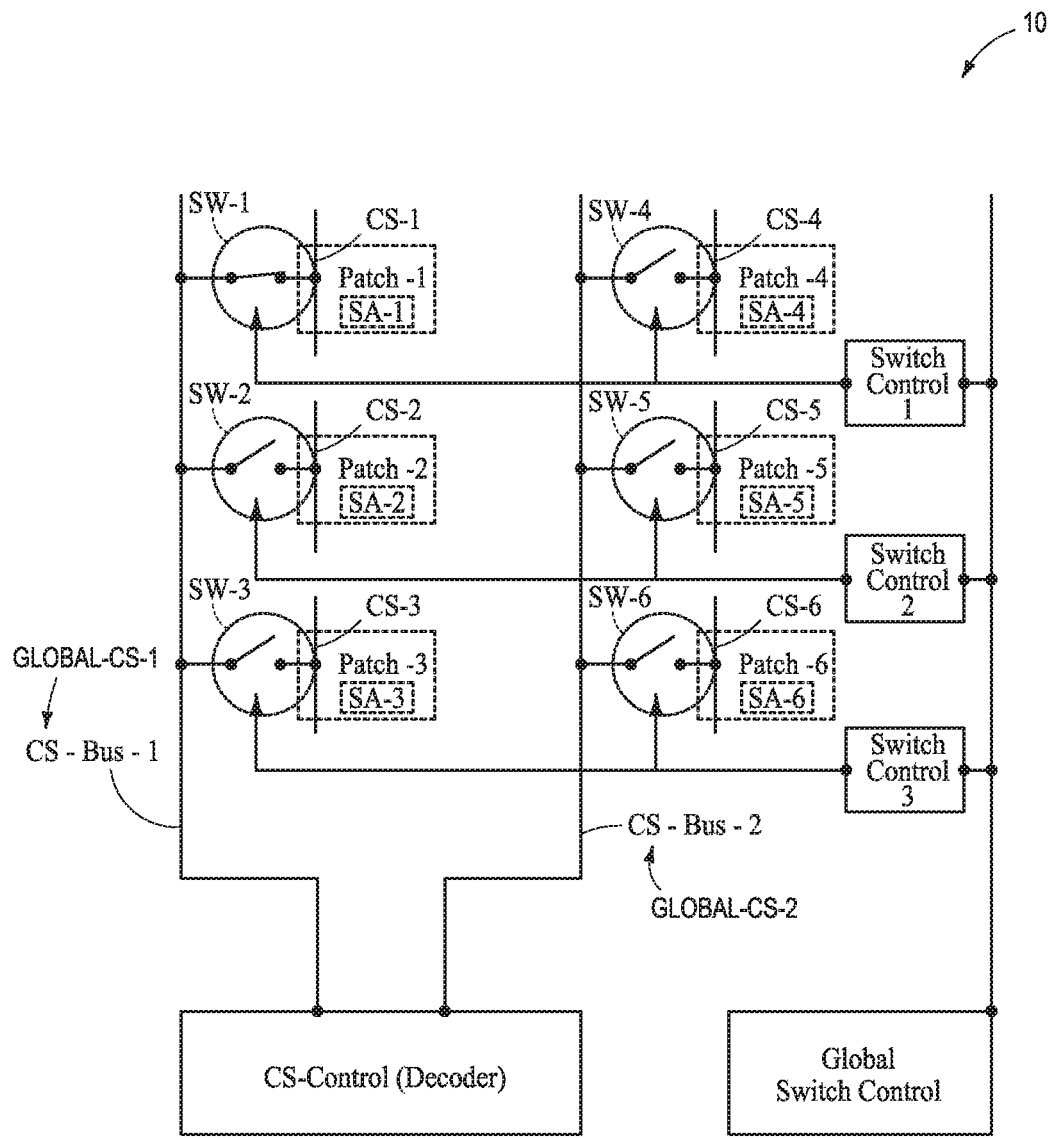
FIG. 8 is a diagrammatic schematic view of the region of the example device of FIG. 7 shown in a different operational mode relative to FIG. 7.
Figure 9:
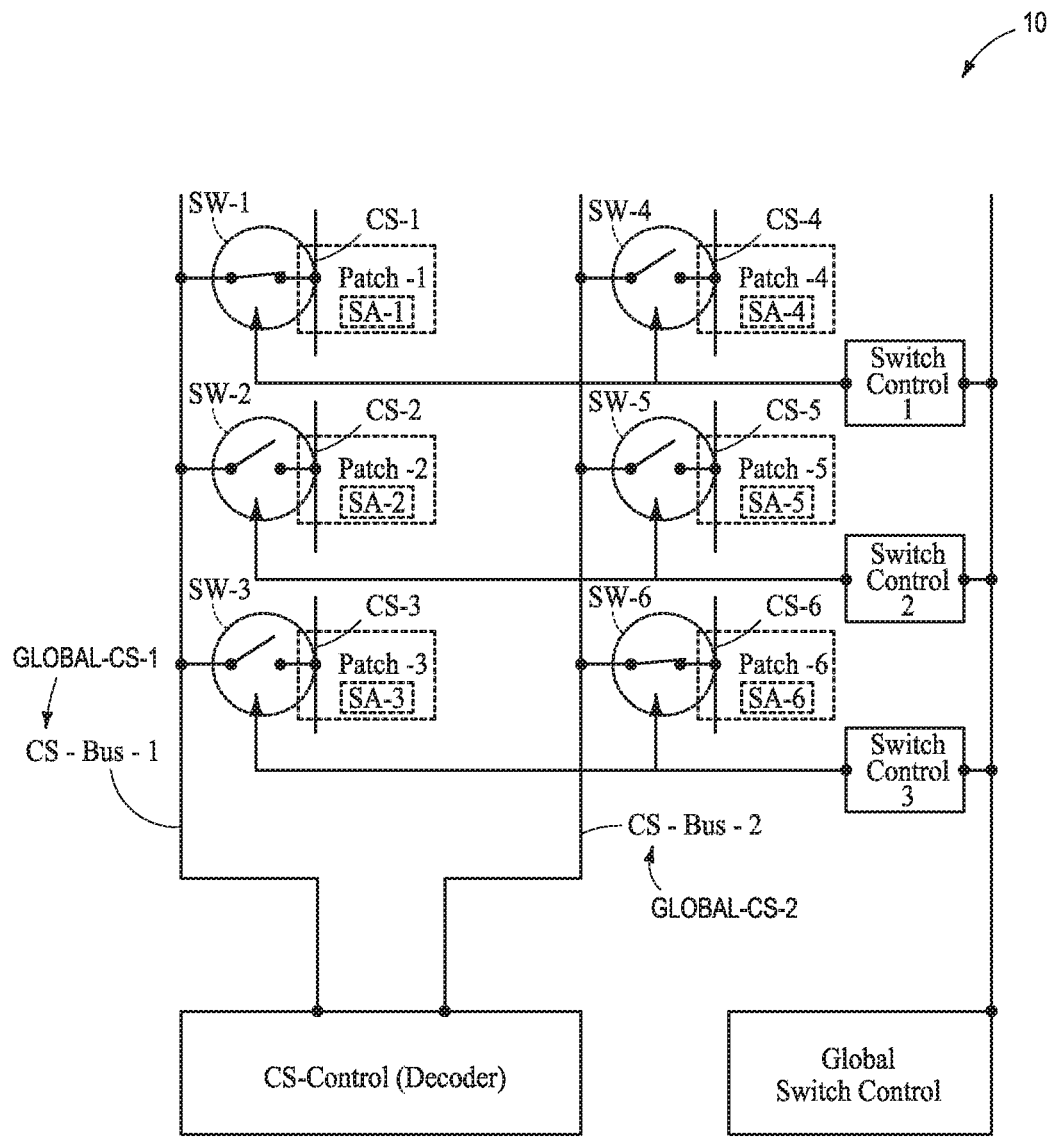
FIG. 9 is a diagrammatic schematic view of the region of the example device of FIG. 7 shown in a different operational mode relative to FIGS. 7 and 8.

FIGS. 8 and 9 illustrate example operational modes of the integrated assembly 10 of FIG. 7. FIG. 8 shows an operational mode in which only one of the switches (SW-1) is in a closed position, while all of the other switches are in an open position. Accordingly, only Patch-1 is coupled with the CS-Control (Decoder), and the other Patches 2-6 are isolated (decoupled) from the CS-Control (Decoder). FIG. 9 shows an operational mode in which one of the switches along the first column-select-bus (CS-Bus-1) is closed (specifically, the switch SW-1), and in which one of the switches along the second column-select-bus (CS-Bus-2) is closed (specifically, the switch SW-6). The remaining switches remain open. Accordingly, the Patches 1 and 6 are coupled with the CS-Control (Decoder), and the other Patches 2-5 are isolated (decoupled) from the CS-Control (Decoder). In other embodiments (not shown) more than two of the illustrated switches of FIG. 9 may be in a closed position during an operational mode of the assembly 10.

Figure 10:
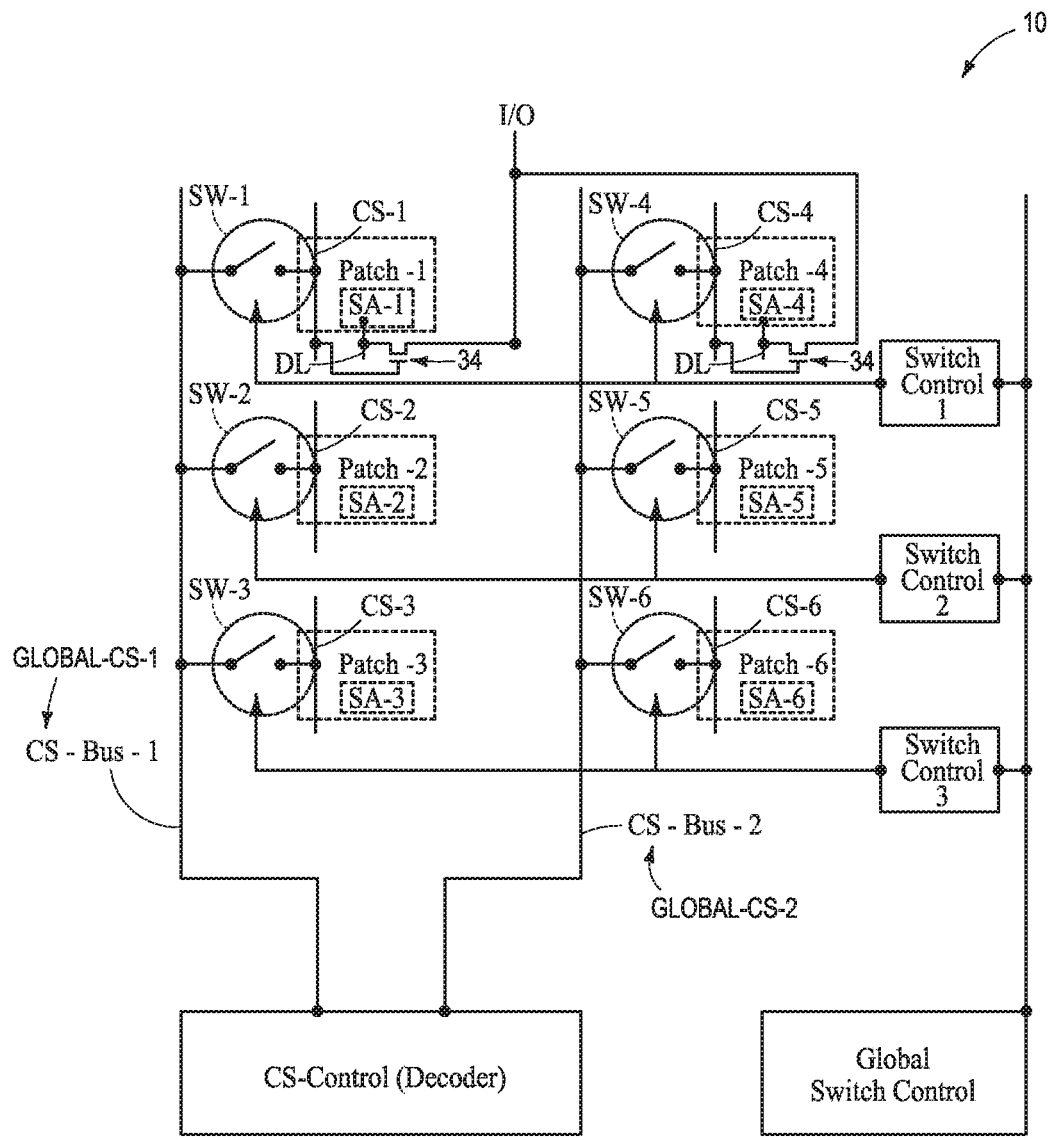
FIG. 10 is a diagrammatic schematic view of the region of the example device of FIG. 7, and additionally shows an example connection to an input/output (I/O).

In some embodiments, two or more of the Patches may share input/output circuitry, since the patches may be selectively decoupled (electrically isolated) relative to one another. For instance, FIG. 10 shows an example application in which Patch-1 and Patch-4 share input/output circuitry (I/O); or in other words, share a connection to an input/output. Each of the patches is shown to comprise a digit line (DL) which is coupled to the I/O through a transistor 34 gatedly controlled by an associated local column-select-structure (CS-1 for Patch-1 and CS-4 for Patch-4). The switches SW-1 and SW-4 may be operated so that either Patch-1 or Patch-4 is operational while the other is decoupled, and accordingly the shared I/O will only be utilized by one of the Patches during an operational mode of assembly 10.

Figure 11:
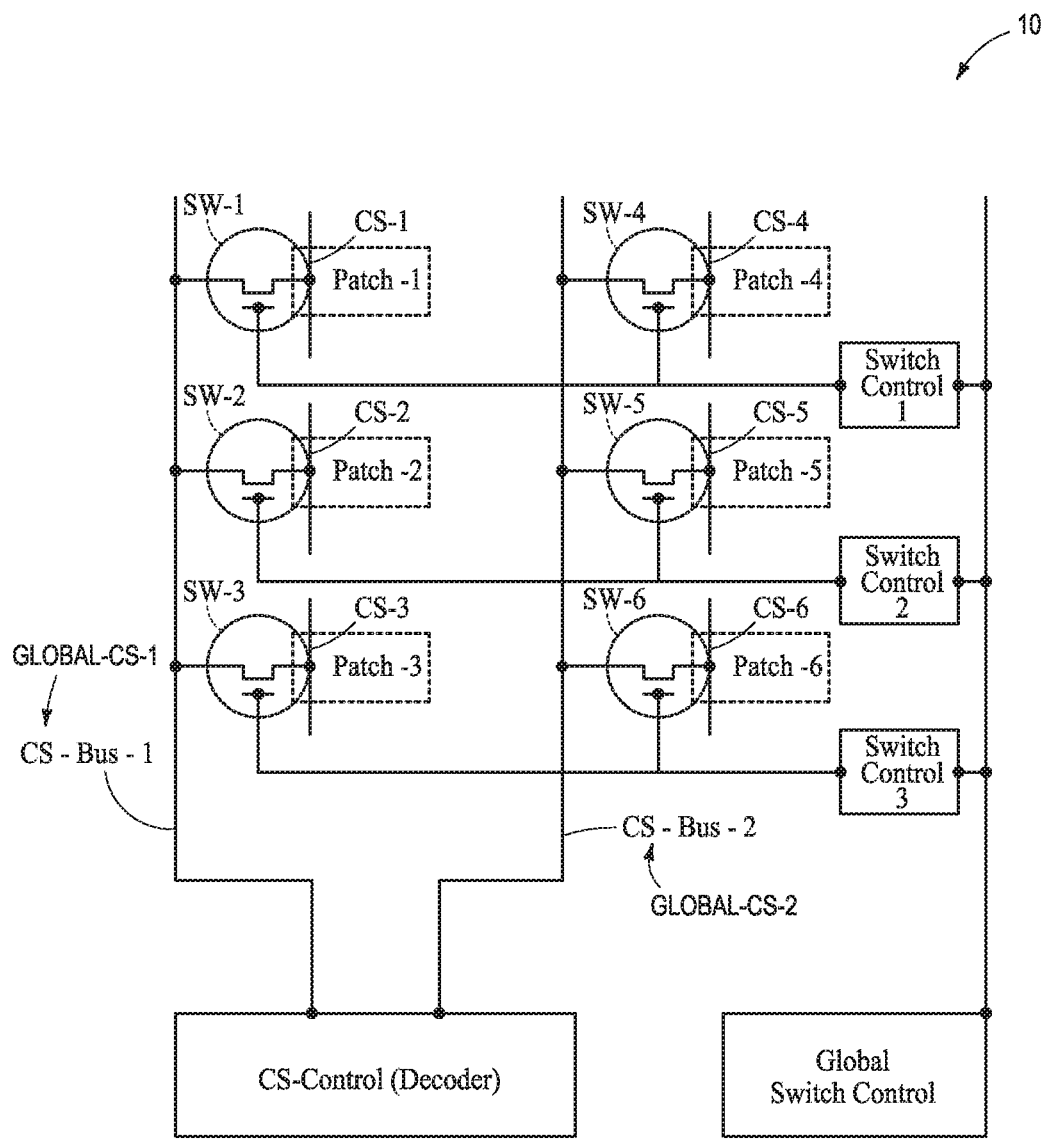
FIG. 11 is a diagrammatic schematic view of the region of the example device of FIG. 7, and additionally shows example switches configured as transistors.

The switches SW-1, SW-2, SW-3, SW-4, SW-5 and SW-6 may be transistors. FIG. 11 schematically illustrates the integrated assembly 10 in an example embodiment in which such switches correspond to example transistors. Gates of the transistors are coupled with the Switch Control Units (Switch Controls 1-3) to selectively couple/decouple the local column-select-structures (e.g., CS-1) from the CS-Buses.

Figure 12:
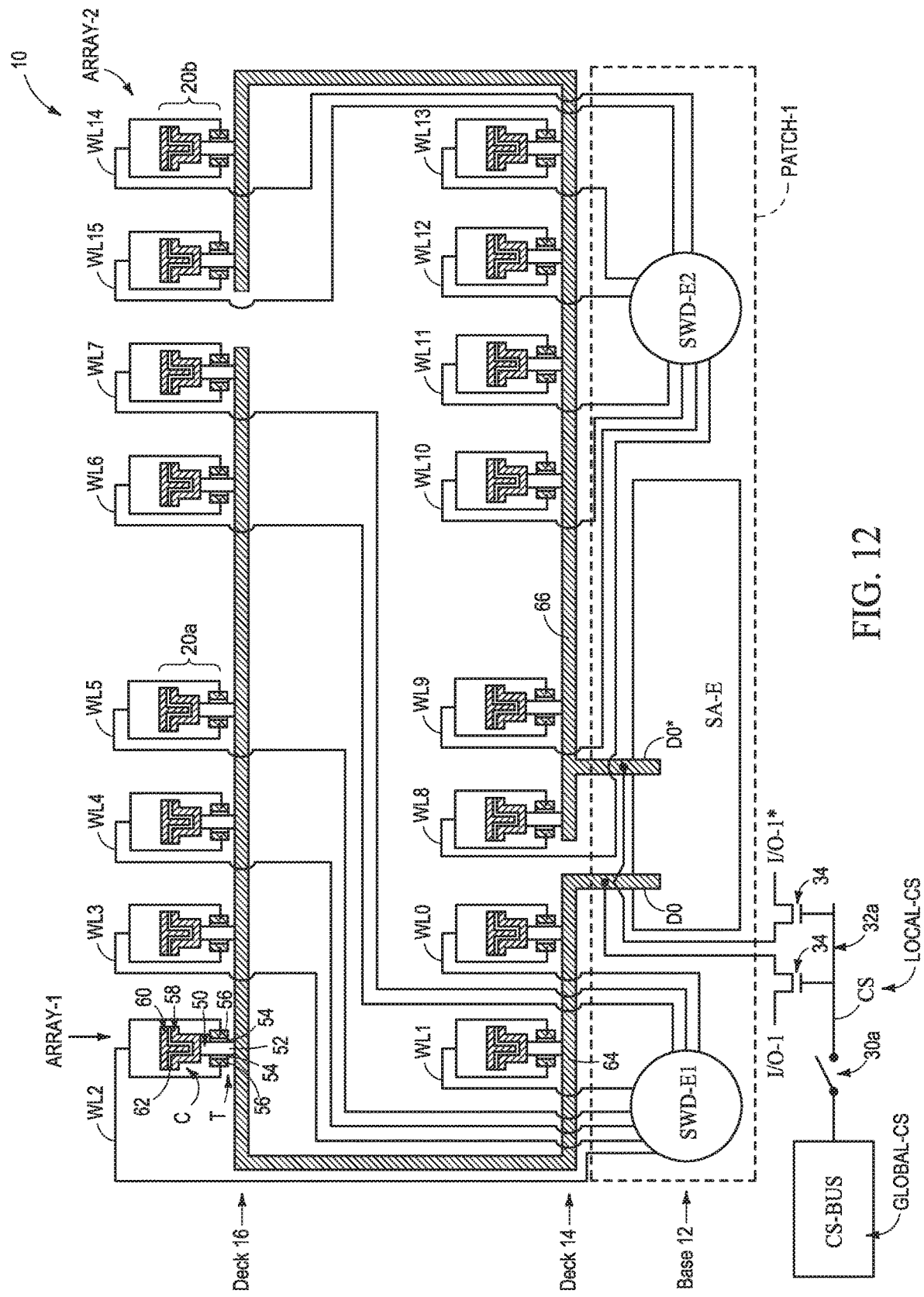
FIG. 12 is a diagrammatic cross-sectional side view and schematic view of a region of an example multi-deck-assembly showing an example arrangement of circuit components.

The memory cells 20a and 20b of FIG. 4 may have any suitable configurations. In some embodiments, the memory cells may be DRAM cells which each comprise an access transistor and a capacitor. FIG. 12 shows an example configuration of a region of the integrated assembly 10, and shows the digit lines D0 and D0*extending from the SA-E module.

The access transistors (T) of the memory cells 20a and 20b are shown to comprise vertically-extending pillars 50 of semiconductor material 52. The semiconductor material 52 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). Source/drain and channel regions (not shown) may be provided within the pillars 50. The pillars 50 may comprise vertically-extending channel regions between the source/drain regions, and accordingly the access transistors T may be considered to correspond to vertically-extending transistors in some embodiments.

Gate dielectric material 54 is along sidewalls of the pillars 50, and conductive gate material 56 is along the gate dielectric material.

The gate dielectric material 54 may comprise any suitable composition(s); and in some embodiments may comprise, consist essentially of, or consist of silicon dioxide.

The conductive gate material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The capacitors (C) of the memory cells 20 and 20b comprise first conductive nodes 58, second conductive nodes 60, and insulative material (capacitor dielectric material) 62 between the first and second conductive nodes.

The first and second conductive nodes 58 and 60 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another.

The insulative material 62 may comprise any suitable composition(s), and in some embodiments may comprise, consist essentially of, or consist of silicon dioxide.

In the shown embodiment, the lower conductive nodes 58 are configured as upwardly-opening containers, and accordingly the capacitors C may be referred to as container-type capacitors. In other embodiments, the lower conductive nodes may have other suitable shapes.

The lower conductive nodes 58 may be referred to as storage nodes, and the upper conductive nodes 60 may be referred to as plate electrodes. In some embodiments, the plate electrodes within ARRAY-1 may all be coupled to one another and the plate electrodes within ARRAY-2 may also all be coupled to one another.

The digit lines D0 and D0* are shown to comprise conductive materials 64 and 66, respectively. Such conductive materials may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 64 and 66 may be the same composition as one another, or may be different compositions relative to one another.

Numerous wordlines (W0-WL15) are diagrammatically illustrated in FIG. 12. The wordlines are coupled with sub-wordline-drivers designated as SWD-E1 and SWD-E2. Such sub-wordline-drivers may include the driver modules SWD-UE and SWD-LE described above with reference to FIG. 4.

The digit lines D0 and D0* are shown to be selectively coupled with input/output circuitry (I/O-1 and I/O-1*) through transistors 34 which are controlled by the local column-select-structure 32a (CS); with such local column-select-structure 32a being coupled to gates of the transistors 34. The column-select-structure 32a is selectively coupled to a CS-BUS (GLOBAL-CS) through the switch 30a.

The view of FIG. 12 shows that each of the digit lines D0 and D0* has a first portion (lower portion) along the lower deck 14, and has a second portion (upper portion) along the upper deck 16. Each of the arrays (ARRAY-1 and ARRAY-2) of memory cells has a first portion (lower portion) along the lower deck 14, and has a second portion (upper portion) along the upper deck 16. In some embodiments, the digit lines associated with the first array (ARRAY-1) may be considered to be first digit lines, while the digit lines associated with the second array (ARRAY-2) may be considered to be second digit lines. Accordingly, the digit line D0 may be considered to be an example of a first digit line, while the digit line D0* may be considered to be an example of a second digit line. The first and second digit lines are comparatively coupled with one another through the sense-amplifier-circuitry, and in the embodiment of FIG. 12 are comparatively coupled with one another through the module SA-E of the sense-amplifier-circuitry.

Figure 13:
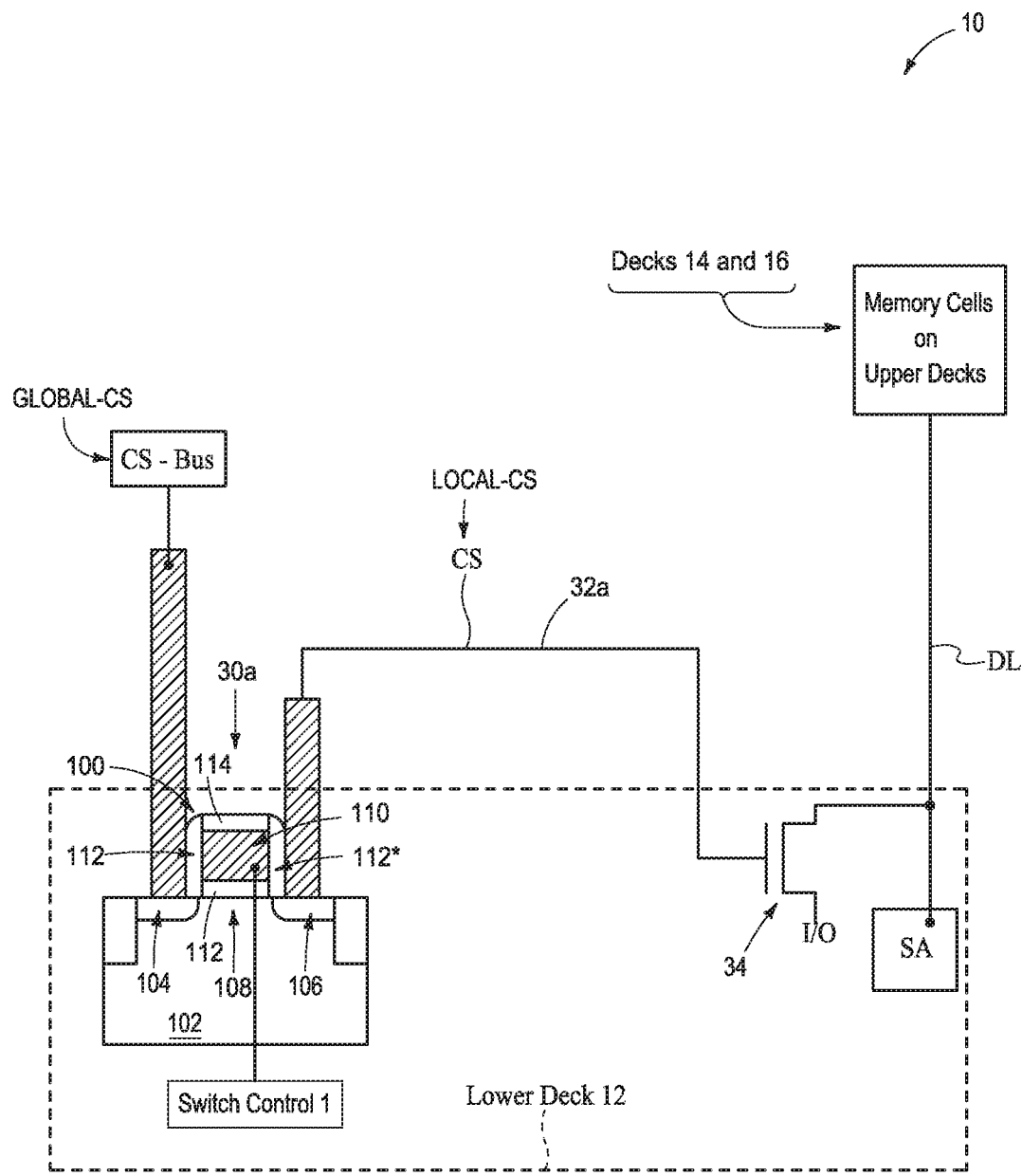
FIG. 13 is a diagrammatic side view and schematic of a region of an example multi-deck-assembly showing an example arrangement of circuit components.

The integrated assembly 10 may comprise any suitable elevational relationship between the various components. FIG. 13 diagrammatically illustrates example relationships. The configuration of FIG. 13 diagrammatically illustrates the lower deck 12 with a dashed-line, and diagrammatically illustrates the memory cells as being on upper decks (decks 14 and 16) which are elevationally above the lower deck 12. The CS-Bus (GLOBAL-CS) is coupled to the local column-select-structure 32a (CS, or LOCAL-CS) through the switch 30a. The local column-select-structure (CS) controls a second transistor 34 which selectively couples input/output circuitry (I/O) with a digit line (DL) extending from memory cells to sense-amplifier-circuitry (SA).

In the shown embodiment, the switch 30a corresponds to a transistor 100 supported by a semiconductor base 102. The semiconductor base 102 may comprise any suitable semiconductor material; including, for example, silicon.

The transistor 100 includes a pair of source/drain regions 104 and 106 which are spaced from one another by an intervening channel region 108. The transistor 100 also includes a conductive gate 110 which is spaced from the channel region 108 by a gate dielectric material 112.

The conductive gate 110 may comprise any suitable conductive composition(s); including, for example, metal silicide, metal nitride, metal, conductively-doped silicon, etc.

The gate dielectric material 112 may comprise any suitable composition(s); such as, for example, silicon dioxide.

Insulative spacers 112 are along the conductive gate 110, and an insulative capping material 114 is over the conductive gate 110. The spacers 112 and capping material 114 may comprise any suitable insulative composition(s); including, for example, silicon dioxide, silicon nitride, etc.

The gate 110 may be electrically coupled to switch-control-circuitry (e.g., Switch Control 1) of the type described above with reference to FIG. 7.

In the illustrated embodiment, a portion of the CS-Bus extends vertically from the source/drain region 104, and a portion of the local CS extends vertically from the source/drain region 106. The local CS then extends above the lower deck 12, and back down to the lower deck 12 to couple with the gate of the transistor 34. The I/O and SA are shown to be along the lower deck 12. In other embodiments, at least some of the I/O circuitry may be elevationally (vertically) offset from the lower deck 12.

The sense-amplifier-modules SA-E and SA-0 of the embodiments described herein may comprise any suitable configurations. An example sense-amplifier-module SA-E of Patch-1 is diagrammatically illustrated in FIG. 14. A dashed line 71 is provided to show an approximate boundary of the sense-amplifier-circuitry. Although the illustrated circuitry is described as being the SA-E module, it is to be understood that the SA-0 module may comprise an identical configuration.

The SA-E module of FIG. 14 includes a p-sense amplifier 80 comprising a pair of cross-coupled pull-up transistors 82 and 84, and includes an n-sense amplifier 86 comprising a pair of cross-coupled pull-down transistors 88 and 90. The p-sense amplifier 80 is coupled with active pull-up circuitry (labeled ACT), and the n-sense amplifier 86 is coupled with a common node (labeled RNL). The illustrated SA-E module is coupled with the digit lines D0 and D0*; or in other words the digit lines D0 and D0* are comparatively coupled with one another through the SA-E module. In operation, the amplifiers 80 and 86 may be utilized together to detect the relative signal voltages of D0 and D0*, and to drive the higher signal voltage to VCC while driving the lower signal voltage to ground. Also, inputs and outputs associated with the module (labeled as I/O) may be utilized for exporting data regarding the relative signal voltages of D0 and D0*, and/or for programming memory cells along one or both of D0 and D0*.

The illustrated module also has equilibration circuitry (labeled EQ) provided therein to balance electrical properties within the module. Other circuitry (not shown) may also be provided within the module. The SA-E module of FIG. 14 may comprise any suitable configuration.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties.

The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first array of first memory cells and a second array of second memory cells. First digit lines extend along columns of the first array. Second digit lines extend along columns of the second array. Sense-amplifier-circuitry is configured to comparatively couple the first digit lines with the second digit lines. The sense-amplifier-circuitry is distributed amongst at least two patch locations. A first of the at least two patch locations has a first portion of the sense-amplifier-circuitry and has a first local column-select-structure. The first local column-select-structure is associated with the first and second digit lines comparatively coupled through the first portion of the sense-amplifier-circuitry. A second of the at least two patch locations has a second portion of the sense-amplifier-circuitry and has a second local column-select-structure. The second local column-select-structure is associated with the first and second digit lines comparatively coupled through the second portion of the sense-amplifier-circuitry. A column-select-bus extends from decoder-circuitry to the first and second local column-select-structures. The column-select-bus is selectively coupled to the first local column-select-structure through a first switch, and is selectively coupled to the second local column-select-structure through a second switch.

Some embodiments include an integrated assembly comprising a first array of first memory cells and a second array of second memory cells. First digit lines extend along columns of the first array. Second digit lines extend along columns of the second array. Sense-amplifier-circuitry is configured to comparatively couple the first digit lines with the second digit lines. The sense-amplifier-circuitry is subdivided amongst at least four patch locations. A first of the at least four patch locations has a first portion of the sense-amplifier-circuitry and has a first local column-select-structure. A second of the at least four patch locations has a second portion of the sense-amplifier-circuitry and has a second local column-select-structure. A third of the at least four patch locations has a third portion of the sense-amplifier-circuitry and has a third local column-select-structure. A fourth of the at least four patch locations has a fourth portion of the sense-amplifier-circuitry and has a fourth local column-select-structure. A first column-select-bus extends from decoder-circuitry to the first and second local column-select-structures. The first column-select-bus is selectively coupled to the first local column-select-structure through a first switch, and is selectively coupled to the second local column-select-structure through a second switch. A second column-select-bus extends from the decoder-circuitry to the third and fourth local column-select-structures. The second column-select-bus is selectively coupled to the third local column-select-structure through a third switch, and is selectively coupled to the fourth local column-select-structure through a fourth switch.

Some embodiments include an integrated assembly comprising a base supporting sense-amplifier-circuitry. The sense-amplifier-circuitry is subdivided amongst at least two spaced-apart patch locations. Each of the patch locations includes a SA-O region and a SA-E region. A first local column-select-structure is associated with the first patch location and a second local column-select-structure is associated with the second patch location. A column-select-bus extends from decoder circuitry to the first and second local column-select-structures. The column-select-bus is selectively coupled to the first local column-select-structure through a first switch, and is selectively coupled to the second local column-select-structure through a second switch. A first deck is over the base. The first deck comprises a first portion of a first array of first memory cells, and comprises a first portion of a second array of second memory cells. A second deck is over the first deck. The second deck comprises a second portion of the first array of the first memory cells, and comprises a second portion of the second array of the second memory cells. First digit lines are associated with the first array. Second digit lines are associated with the second array. The first and second digit are comparatively coupled with one another through the sense-amplifier-circuitry.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a first array of first memory cells;
a second array of second memory cells;
first digit lines extending along columns of the first array;
second digit lines extending along columns of the second array;

sense-amplifier-circuitry configured to comparatively couple the first digit lines with the second digit lines; the sense-amplifier-circuitry being distributed amongst at least two patch locations; a first of the at least two patch locations having a first portion of the sense-amplifier-circuitry and having a first local column-select-structure; the first local column-select-structure being associated with the first and second digit lines comparatively coupled with through the first portion of the sense-amplifier-circuitry; a second of the at least two patch locations having a second portion of the sense-amplifier-circuitry and having a second local column-select-structure; the second local column-select-structure being associated with the first and second digit lines comparatively coupled through the second portion of the sense-amplifier-circuitry; and a column-select-bus extending from decoder-circuitry to the first and second local column-select-structures; the column-select-bus being selectively coupled to the first local column-select-structure through a first switch, and being selectively coupled to the second local column-select-structure through a second switch.

2. The integrated assembly of claim 1 comprising wordlines extending along rows of the first and second arrays, and wherein the first and second patch locations include wordline-driver-circuitry coupled with the wordlines.

3. The integrated assembly of claim 1 wherein the first and second switches are transistors.

4. The integrated assembly of claim 1 wherein the first and second digit lines are selectively coupled with input/output circuitry, and wherein the first and second local column-select-structures control the selective coupling of the first and second digit lines with the input/output circuitry.

5. The integrated assembly of claim 1 wherein the first and second digit lines are selectively coupled with input/output circuitry through transistor devices, and wherein the first and second local column-select-structures are coupled with gates of the transistor devices.

6. The integrated assembly of claim 1 wherein the first and second arrays are over the sense-amplifier-circuitry.

7. The integrated assembly of claim 6 wherein the sense-amplifier-circuitry is supported by a base deck; wherein two additional decks are over the base deck, with said two additional decks being a first deck and a second deck; wherein the first array has some of the first memory cells along the first deck and has some of the first memory cells along the second deck; and wherein the second array has some of the second memory cells along the first deck and has some of the second memory cells along the second deck.

8. The integrated assembly of claim 7 wherein each of the first digit lines extends along both of the first and second decks, and wherein each of the second digit lines extends along both of the first and second decks.

9. The integrated assembly of claim 8 comprising wordlines extending along rows of the first and second arrays; wherein the first and second patch locations include wordline-driver-circuitry coupled with the wordlines; wherein the sense-amplifier-circuitry within each of the patch locations is subdivided amongst two separate modules corresponding to SA-O and SA-E, and wherein the wordline-driver-circuitry within each of the patch locations is subdivided amongst at least two separate modules.

10. The integrated assembly of claim 1 wherein:
the first patch location has a first orientation when viewed from above; and
the second patch location has a second orientation when viewed from above, with the second orientation being inverted relative to the first orientation.

11. The integrated assembly of claim 1 comprising more than two of the patch locations.

12. The integrated assembly of claim 1 wherein the first and second memory cells are DRAM cells.

13. The integrated assembly of claim 12 wherein each of the DRAM cells comprises a vertically-extending access transistor under a container-type capacitor.

14. An integrated assembly, comprising:
a first array of first memory cells;
a second array of second memory cells;
first digit lines extending along columns of the first array;
second digit lines extending along columns of the second array;
sense-amplifier-circuitry configured to comparatively couple the first digit lines with the second digit lines; the sense-amplifier-circuitry being subdivided amongst at least four patch locations; a first of the at least four patch locations having a first portion of the sense-amplifier-circuitry and having a first local column-select-structure; a second of the at least four patch locations having a second portion of the sense-amplifier-circuitry and having a second local column-select-structure; a third of the at least four patch locations having a third portion of the sense-amplifier-circuitry and having a third local column-select-structure; a fourth of the at least four patch locations having a fourth portion of the sense-amplifier-circuitry and having a fourth local column-select-structure;
a first column-select-bus extending from decoder-circuitry to the first and second local column-select-structures; the first column-select-bus being selectively coupled to the first local column-select-structure through a first switch, and being selectively coupled to the second local column-select-structure through a second switch; and
a second column-select-bus extending from the decoder-circuitry to the third and fourth local column-select-structures; the second column-select-bus being selectively coupled to the third local column-select-structure through a third switch, and being selectively coupled to the fourth local column-select-structure through a fourth switch.

15. The integrated assembly of claim 14 wherein the first, second, third and fourth switches are transistors.

16. The integrated assembly of claim 14 wherein the first, second, third and fourth switches are all coupled to global-switch-control-circuitry.

17. The integrated assembly of claim 16 wherein the first and third switches are both coupled to a first local switch-control-circuit with in turn is coupled to the global-switch-control-circuitry, and wherein the second and fourth switches are both coupled to a second local switch-control-circuit with in turn is coupled to the global-switch-control-circuitry.

18. The integrated assembly of claim 14 in an operational mode in which only one of said at least four switches is in a closed position while all others of the at least four switches are in an open position.

19. The integrated assembly of claim 14 in an operational mode in which at least two of said at least four switches are in a closed position while at least one other of the at least four switches is in an open position.

20. The integrated assembly of claim 14 wherein the first and third patch locations share a connection to an input/output.

21. The integrated assembly of claim 14 comprising more than four of the patch locations.

22. An integrated assembly, comprising:
- a base comprising sense-amplifier-circuitry, the sense-amplifier-circuitry being subdivided amongst at least two spaced-apart patch locations; each of the patch locations including a SA-O region and a SA-E region;
- a first local column-select-structure associated with the first patch location and a second local column-select-structure associated with the second patch location;
- a column-select-bus extending from decoder circuitry to the first and second local column-select-structures; the column-select-bus being selectively coupled to the first local column-select-structure through a first switch, and being selectively coupled to the second local column-select-structure through a second switch;
- a first deck over the base; the first deck comprising a first portion of a first array of first memory cells, and comprising a first portion of a second array of second memory cells;
- a second deck over the first deck; the second deck comprising a second portion of the first array of the first memory cells, and comprising a second portion of the second array of the second memory cells;
- first digit lines associated with the first array;
- second digit lines associated with the second array; and
- the first and second digit lines being comparatively coupled with one another through the sense-amplifier-circuitry.

23. The integrated assembly of claim 22 wherein:
- the first digit lines are utilized to address the first memory cells;
- first wordlines are also utilized to address the first memory cells;
- each of the first memory cells is uniquely addressed by one of the first digit lines and one of the first wordlines;
- the second digit lines are utilized to address the second memory cells;
- second wordlines are also utilized to address the second memory cells; and
- each of the second memory cells is uniquely addressed by one of the second digit lines and one of the second wordlines.

24. The integrated assembly of claim 23 wherein the first and second wordlines are coupled with wordline-driver-circuitry which is along the base and within the patch locations.

25. The integrated assembly of claim 24 wherein at least one of the patch locations is directly under the first and second memory arrays.

26. The integrated assembly of claim 22 wherein the first and second switches are transistors.

27. The integrated assembly of claim 22 wherein the first and second digit lines are selectively coupled with input/output circuitry, and wherein the first and second local column-select-structures control the selective coupling of the first and second digit lines with the input/output circuitry.

28. The integrated assembly of claim 22 comprising more than two of the patch locations.

29. The integrated assembly of claim 22 wherein the first and second memory cells are DRAM cells.

30. The integrated assembly of claim 29 wherein each of the DRAM cells comprises a vertically-extending access transistor under a capacitor.

* * * * *